(12) United States Patent
Adan et al.

(10) Patent No.: US 10,049,904 B1
(45) Date of Patent: Aug. 14, 2018

(54) METHOD AND SYSTEM FOR MOVING A SUBSTRATE

(71) Applicants: APPLIED MATERIALS ISRAEL LTD., Rehovot (IL); APPLIED MATERIALS, INC., Santa Clara, CA (US)

(72) Inventors: Ofer Adan, Rehovot (IL); Israel Avneri, Ramat-Gan (IL); Yoram Uziel, Yodfat (IL); Igor Krivts (Krayvitz), Rehovot (IL); Niranjan Ramchandra Khasgiwale, San Jose, CA (US)

(73) Assignees: Applied Materials, Inc., Santa Clara, CA (US); Applied Materials Israel Ltd., Rehovot (IL)

( * ) Notice: Subject to any disclaimer, the term of this patent is extended or adjusted under 35 U.S.C. 154(b) by 0 days.

(21) Appl. No.: 15/668,517

(22) Filed: Aug. 3, 2017

(51) Int. Cl.
| | |
|---|---|
| H01L 21/677 | (2006.01) |
| H01L 21/687 | (2006.01) |
| H01L 21/68 | (2006.01) |
| H01L 21/67 | (2006.01) |
| H01L 21/66 | (2006.01) |

(52) U.S. Cl.
CPC .... *H01L 21/6719* (2013.01); *H01L 21/67259* (2013.01); *H01L 21/681* (2013.01); *H01L 21/68714* (2013.01); *H01L 22/12* (2013.01)

(58) Field of Classification Search
USPC ............ 156/345.44, 345.51, 345.52, 345.55; 118/728, 729, 730, 733, 663, 200, 218, 118/238, 241, 244, 258, 262, 526
See application file for complete search history.

(56) References Cited

U.S. PATENT DOCUMENTS

| | | | | |
|---|---|---|---|---|
| 6,358,324 B1* | 3/2002 | Hongoh | ............... | C23C 16/0209 118/713 |
| 6,764,386 B2* | 7/2004 | Uziel | ................ | H01L 21/67017 451/36 |
| 6,899,765 B2* | 5/2005 | Krivts | ............... | H01L 21/67126 118/719 |
| 7,582,186 B2* | 9/2009 | Strang | ............... | H01J 37/32642 118/728 |
| 2004/0129226 A1* | 7/2004 | Strang | ............... | H01J 37/32642 118/728 |
| 2014/0239529 A1* | 8/2014 | Tan | ........................ | G03F 7/0002 264/40.5 |
| 2016/0163570 A1* | 6/2016 | Rice | .................. | H01L 21/67126 414/217 |

* cited by examiner

*Primary Examiner* — Bernard Souw
(74) *Attorney, Agent, or Firm* — Kilpatrick Townsend & Stockton LLP (57) ABSTRACT

A method and a system for moving a substrate, the system includes a chamber, a chuck, a movement system that is positioned outside the chamber, a controller, an intermediate element, at least one sealing element that is configured to form a dynamic seal between the intermediate element and the chamber housing. The movement system is configured to repeat, for each region of the substrate out of a plurality of regions of the substrate, the steps of: rotating the chuck to position a given portion of the region of the substrate within a field of view that is related to an opening of the chamber housing; and moving the chuck relation to the opening to position additional portions of the region of the substrate within the field of view that is related to the opening.

15 Claims, 9 Drawing Sheets

METHOD AND SYSTEM FOR MOVING A SUBSTRATE

BACKGROUND OF THE INVENTION

Integrated circuits are manufactured by building semiconductor devices on one or more substrates in a process chamber. The semiconductor devices are interconnected to form the integrated circuit (IC). A semiconductor wafer may have one, or many, or a few ICs.

Semiconductor devices are fabricated on substrates such as silicon wafers by processes that involve depositing, patterning, and removing of materials on the substrates.

Deposition processes such as chemical vapor deposition (CVD) or physical vapor deposition (PVD) may be used to deposit a layer of material on a substrate.

Photolithography techniques may be used to create a pattern on a layer of material to control where etching, depositing, or implanting will occur.

Etch processes may be used to remove portions of a deposited layer, so that other materials may be deposited in the removed portions.

Ion implantation processes may be used to change the properties of a deposited layer of material by physically bombarding and implanting dopants into the deposited layer.

By using various ones of these process steps, semiconductor devices, and, thus, integrated circuits are created on the substrate.

In fabricating ICs, specialized process chambers are used sequentially to perform the steps required to build the semiconductor devices and the ICs. For a complex integrated circuit, hundreds of individual process steps may be involved in building and interconnecting all of the underlying semiconductor devices.

To streamline the manufacturing process, process chambers may be integrated into a cluster tool, so that the different process steps may be executed sequentially and efficiently, using less factory space than stand-alone chambers, and requiring less distance to transport wafers from process step to process step.

A cluster tool provides process sequence integration by "clustering" several different process chambers into one platform.

By using a cluster tool different processes can take place in sequence on the same platform without the need to break pressure seals in the process environment. As a result, there may be fewer opportunities for unwanted contamination to occur.

In addition, it is possible to save some or all of the time involved in completely venting up a chamber, moving a substrate from stand-alone chamber to stand-alone chamber, and then pumping down each succeeding chamber to achieve the necessary level of vacuum to conduct the next process sequence.

Because of the complexity of the manufacturing process, there is frequent inspection of substrates to ensure that the process steps are executed properly and that the substrates are reasonably free of defects, preferably as free of defects as is practicable.

Process chambers are usually designed and built to meet dimensional footprint requirements of the manufacturing floor on which the semiconductor fabrication tools are located. However, there are no similar requirements for inspection systems, and conventional measurement/inspection systems, typically, can be relatively bulky, and can have relatively large footprints.

Therefore, inspection systems usually are not integrated into cluster tools, but instead are separate from cluster tools. Accordingly, an evaluation chamber that can be integrated into a cluster tool would further streamline the manufacturing process for integrated circuits.

There is a need to allow efficient and relatively a small footprint, compact measurement/inspection system that is connected or integrated with a process tool, or a process control tool to enable a better control loop by processing and receiving immediate high resolution imaging data. Such apparatus is also contamination free system for moving a substrate.

SUMMARY

There may be provided a system for moving a substrate, the system may include a chamber that may include a chamber housing, the chamber housing may include an opening; a chuck that may be configured to support the substrate; a movement system that may be mechanically coupled to the chuck and may be positioned outside the chamber; a controller that may be configured to control the movement system; an intermediate element that may be positioned between the chamber housing and the movement system; at least one sealing element that may be configured to form a dynamic seal between the intermediate element and the chamber housing, wherein the dynamic seal seals the chamber from the movement system. The movement system may be configured to repeat, for each region of the substrate out of a plurality of regions of the substrate, the steps of: rotating the chuck to position a given portion of the region of the substrate within a field of view that may be related to an opening of the chamber housing; and moving the chuck relation to the opening to position additional portions of the region of the substrate within the field of view that may be related to the opening.

The movement system may include a rotary stage for rotating the chuck.

The movement system may include an X-axis Y-axis (XY) stage for moving the chuck in relation to the opening.

The movement system may be configured to move the intermediate element in relation to the chamber housing while moving the chuck in relation to the opening.

The movement system may be configured to move the intermediate element by up to a maximal distance in any direction, wherein the maximal distance does not exceed one hundred and twenty percent of a radius of the substrate.

The system may include sensors that may be fixed in relation to the substrate.

There may be provided a method for moving a substrate within a chamber that may include a chamber housing, the method may include: positioning the substrate on a chuck that may be positioned within the chamber; wherein the chuck may be mechanically coupled to a movement system; sealing the chamber from the movement system by forming, by at least one sealing element, a dynamic seal between an intermediate element and the chamber housing; wherein the intermediate element may be positioned between the chamber housing and the movement system; repeating, for each region of the substrate out of a plurality of regions of the substrate, the steps of: rotating the chuck, by the movement system, to position a given portion of the region of the substrate within a field of view that may be related to an opening of the chamber housing; and moving the chuck, by the movement system, in relation to the opening to position additional portions of the region of the substrate within the field of view that may be related to the opening.

The rotating of the chuck may include using a rotary stage of the movement system to rotate the chuck.

The moving of the chuck may include using an X-axis and Y-axis (XY) stage of the movement system.

The method may include moving the intermediate element in relation to the chamber housing while moving the chuck in relation to the opening.

The method may include moving the intermediate element by up to a maximal distance in any direction, wherein the maximal distance does not exceed one hundred and twenty percent of a radius of the substrate.

There may be provided a method for evaluating a substrate, the method may include positioning the substrate on a chuck that may be positioned within a chamber that may include a chamber housing; wherein the chuck may be mechanically coupled to a movement system; sealing the chamber from the movement system by forming, by at least one sealing element, a dynamic seal between an intermediate element and the chamber housing; wherein the intermediate element may be positioned between the chamber housing and the movement system; repeating, for each region of the substrate out of a plurality of regions of the substrate, the steps of: rotating the chuck, by the movement system, to position a given portion of the region of the substrate within a field of view of a microscope; moving the chuck, by the movement system, in relation to the opening to position additional portions of the region of the substrate within the field of view of the microscope; and evaluating, using the microscope, suspected defects of the substrates that may be positioned in the additional portions of the region of the substrate.

The microscope may be a scanning electron microscope.

BRIEF DESCRIPTION OF THE DRAWINGS

The subject matter regarded as the invention is particularly pointed out and distinctly claimed in the concluding portion of the specification. The invention, however, both as to organization and method of step, together with substrates, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Any reference in the specification to a method should be applied mutatis mutandis to a system capable of executing the method.

Any reference in the specification to a system should be applied mutatis mutandis to a method that may be executed by the system.

The assignment of the same reference numbers to various components may indicate that these components are similar to each other.

There may be provided a chamber that is compact, a system that includes the chamber, a method for moving a substrate with the chamber, and a method for evaluating the substrate while the substrate is positioned within the chamber.

The substrate is positioned on a chuck that is positioned in the chamber. The chuck is moved by a movement system that does not contaminate the chamber because the chamber is sealed from the movement system.

The substrate may be a substrate such as a wafer. The substrate may have a radial symmetry.

A controller may select a selected region of the substrate out of a plurality of regions. The chuck (and hence the substrate) may be rotated by the movement system thereby allowing to evaluate different portions of the selected region.

The movement system may move the chuck between the different portions of the selected region.

After evaluation, a selected region of the substrate, the controller may select a new selected region of the substrate, and the system rotate of the chuck thereby allowing to evaluate different portions of the new selected region.

The evaluation of the substrate may include at least one out of measurement, review and inspection.

The movement of the chuck is required in order to cover only the different portions of the selected region—and the chamber can be compact.

For example—the regions of the substrates may have a quadrant shape and the scanning of each quadrant may require a maximal movement, in each direction, of up to the radius of the substrate- or slightly above (for example 20% above) the radius of the substrate.

For example, in order to evaluate one of the quadrants of a 300 mm wafer—the substrate may be rotated (to select the quadrant) and them moved (for example by an XY stage) along the X axis or along the Y axis by no more than 150 mm.

The chamber may be used for evaluating the substrate and therefore may be referred to as an evaluation chamber.

Figure 1:
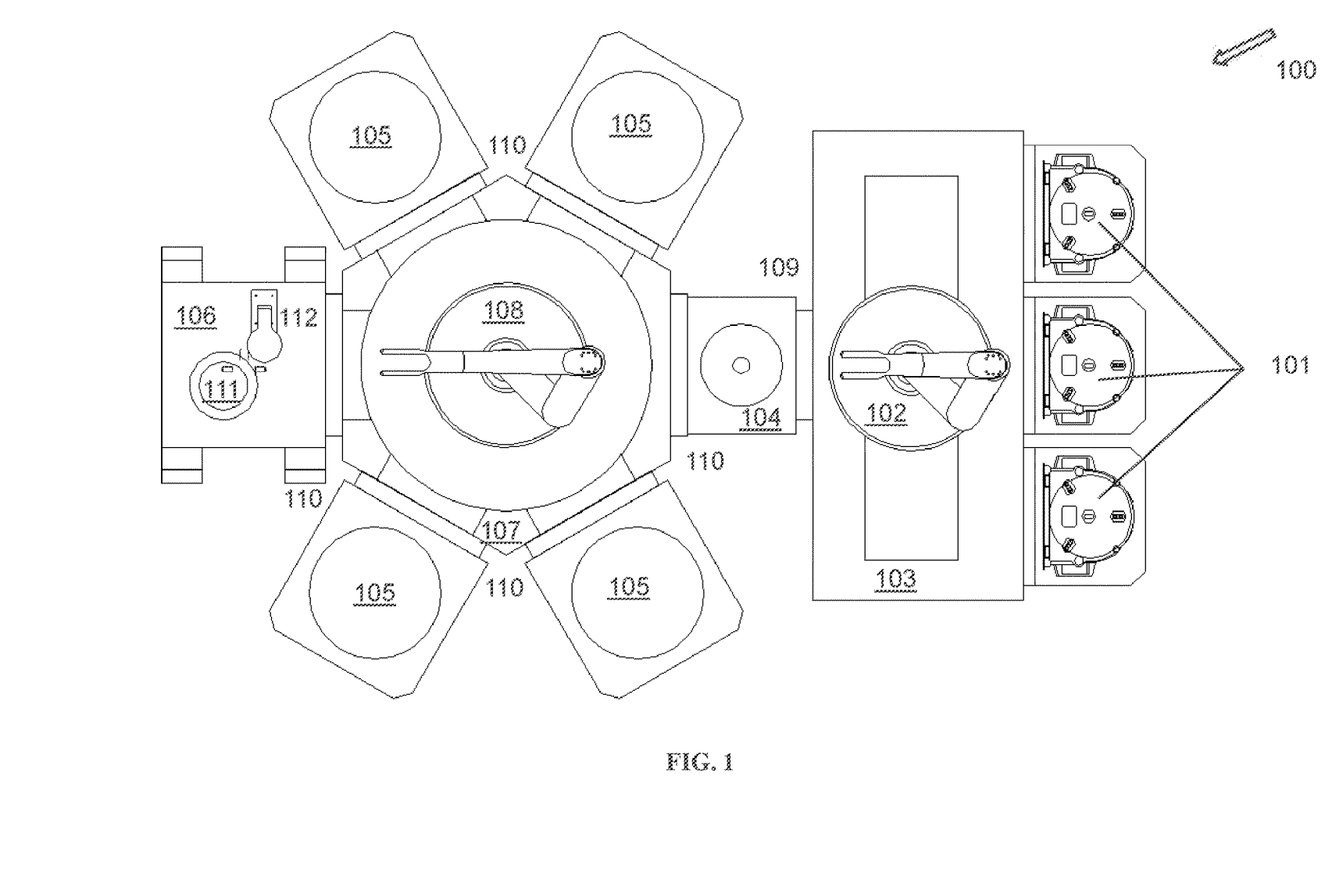
FIG. 1 is an example of a top view of a cluster tool.

FIG. 1 illustrates an example of a cluster tool 100 that includes evaluation chamber 106 as well as other units.

Figure 2:
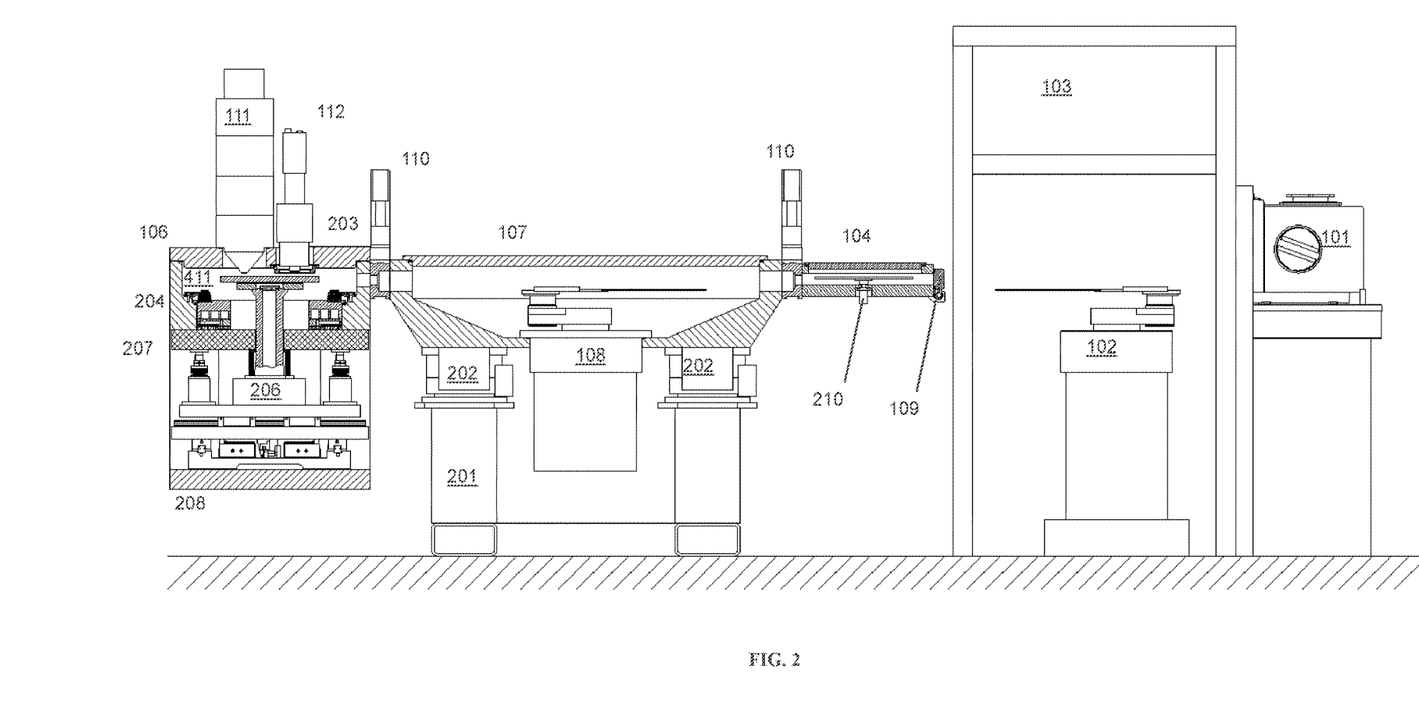
FIG. 2 is an example of a cross sectional view of a cluster tool.

FIG. 2 is an example of a cross section view of cluster tool 100. The cross section is taken along an imaginary plane that does not cross the center of cluster tool 100.

In cluster tool 100, substrates such as wafers are transported in a wafer cassette 101.

The wafer cassette 101 is loaded on load ports of the factory interface unit 103.

An outside transfer robot 102, which is located into factory interface unit 103, transfers the substrates from wafer cassette 101 to load lock 104.

One or more vacuum pumps (not shown) connected to the load lock 104 may pump down the load lock 104 to a desired pressure level that may approximate the pressure level in transfer chamber 107.

An external gate 109 and internal gate 110 of the load lock 104 with vacuum pumps and venting system (not shown) provide necessary vent/pump cycle of the load lock 104.

Inside transfer robot 108 picks up a substrate from the load lock 104 and loads the substrate into any of the process chambers 105 or into evaluation chamber 106 in the cluster tool 100.

Depending on the process chamber 105 into which the substrate is inserted, material may be deposited on, or patterned on, or removed from the substrate.

The substrate may be transferred from the load lock 104 to any process chamber 105, and from one process chamber 105 to another process chamber 105 under a controlled pressure level, including various levels of vacuum.

The pressure levels within the load lock 104, the transfer chamber 107, each of the process chambers 105 and the evaluation chamber 106 may be maintained at substantially the same or different pressure levels, as desired, depending on the needs of the particular process in a given process chamber 105.

Internal gates 110 are mounted between transfer chamber 107, process chambers 105 and evaluation chamber 106. The internal gates 110 provide prevention of the substrates cross contamination.

A scanning electron microscope 111 and an optical microscope 112 are installed on a cover of the evaluation chamber 106.

FIG. 2 also illustrates:
a. Vibration isolation system 202, which is installed on the chassis 201. The vibration isolation system 202 supports the transfer chamber 107. Such configuration allows reaching a high-resolution image of the substrate features and improves the quality of treatment in process chambers 105.
b. A housing of the evaluation chamber that include cover 203 and sidewalls 204.
c. Chuck 205. Chuck 205 may be an electrostatic chuck or a mechanical chuck. Chuck 205 may support a substrate.
d. Movement system 206.
e. An intermediate element such as sealing plate 207.
f. Movement system base 208.
g. AB/DP module 400. AB/DP stands for air bearing/differential pumping.
h. Vacuumed space 411 that is defined by the housing of the evaluation chamber and the sealing plate 207.

The movement system 206 includes a rotation stage (also referred to as theta stage) for rotating the substrate, a Z stage and may also include one stage such as an XY stage or a R stage.

Figure 3:
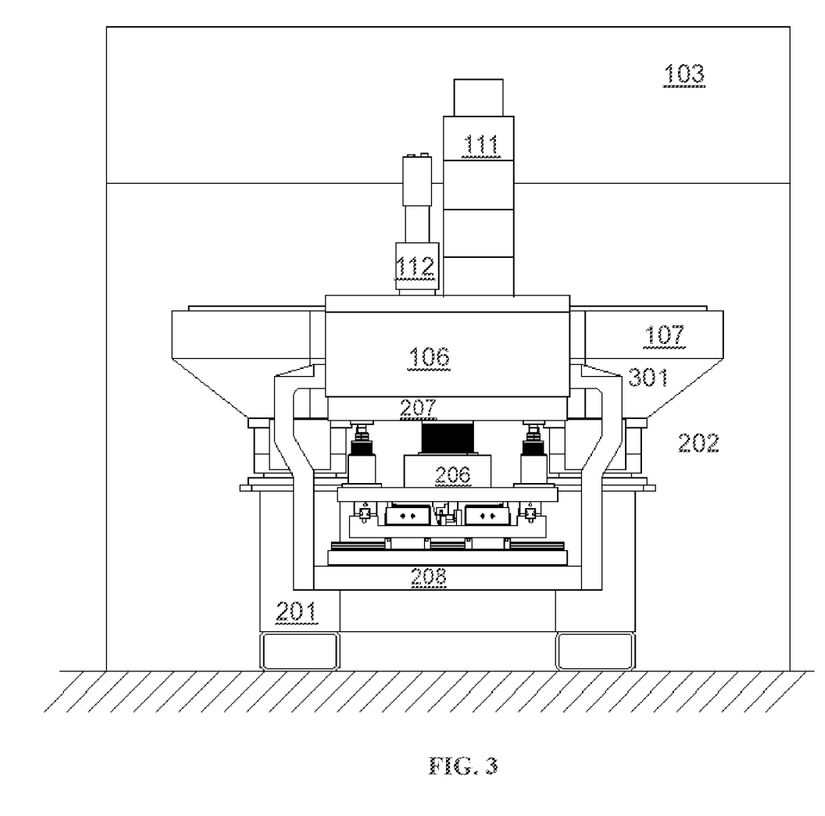
FIG. 3 is an example of a rear view of a cluster tool.

FIG. 3 is an example of a rear view of the evaluation chamber 106. The movement system base 208 has brackets 301. The brackets 301 are connected to the sidewalls 204 of the evaluation chamber 106.

The evaluation chamber 106 prevents sources of contamination from contaminating a substrate.

The substrate, during evaluation processes or manufacturing processes, is located in the vacuumed space 411 in which predetermined conditions (contamination level, vacuum level, temperature and the like) are maintained even when the substrate is moved by the movement system 206.

The movement system 206 may be located in atmosphere environment. Cables, control device and various other components can be located in atmosphere in order to reduce and even eliminate the amount of contaminating elements generated within the atmosphere. The chamber can be free of moving parts.

Figure 4:
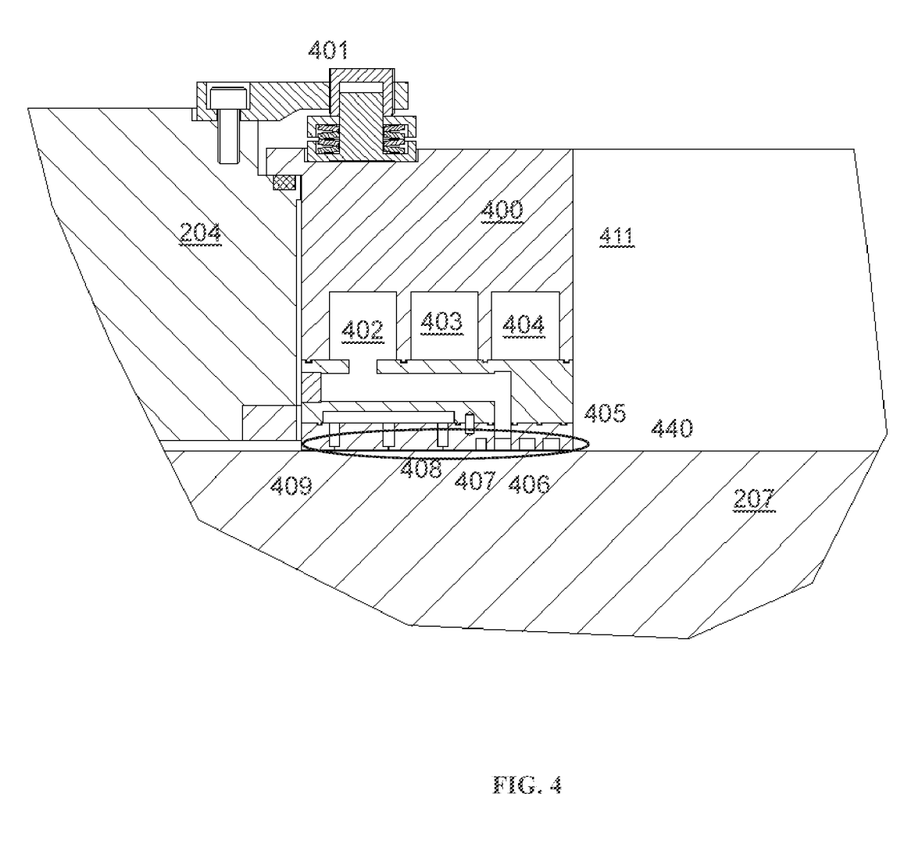
FIG. 4 is an example of a cross sectional view of some evaluation chamber elements that illustrates a dynamic seal.
Figure 5:
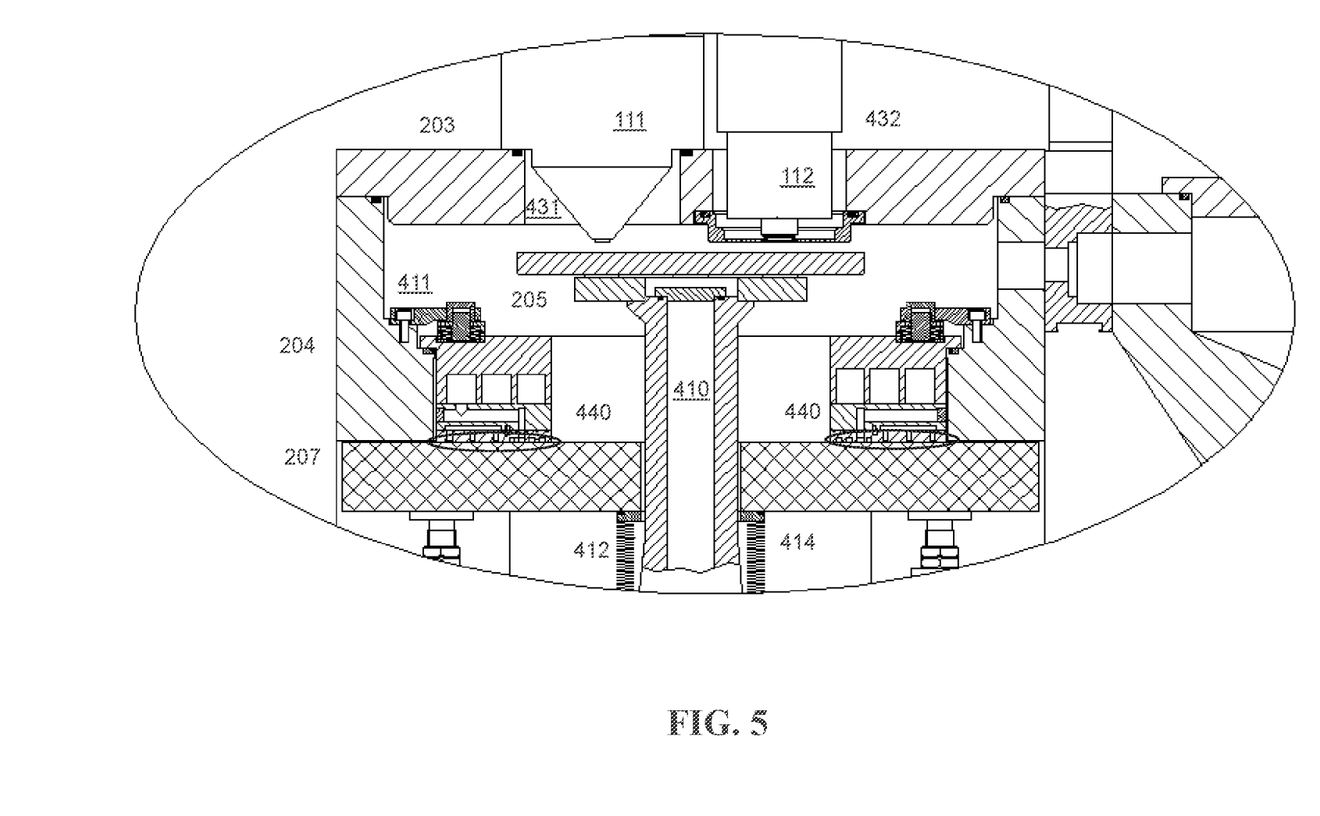
FIG. 5 is an example of a cross sectional view of some evaluation chamber elements.

The vacuumed space can be isolated from atmosphere environment by using one or more dynamic seals—such as dynamic seals 440 of FIGS. 4 and 5.

Contamination which is generated by the movement system 206, by bearing and from plastic cables may be prevented from reaching the vacuumed space 411 due to a positive air flow formed by the dynamic seal. The dynamic seal can be arranged to generate an air flow directed towards the atmosphere and thus repel contamination from entering the vacuum chamber.

FIG. 4 is a cross sectional view of the area of AB/DP module 400 that illustrates a dynamic seal 440.

The seal is dynamic in the sense that it requires to circulate air.

AB/DP module 400 is mechanically connected to sidewall 204 and forms a dynamic seal 440 between the bottom surface of the AB/DP module 400 and sealing plate 207.

The AB/DP module 400 may include one or more sealing elements such as first vacuum conduit 402, second vacuum conduit 403 and third vacuum conduit 404, each of which is connected with its vacuum pump (not shown in figure).

The bottom surface of AB/DP module 400 includes the three vacuum grooves 405, 406 and 407 and atmospheric pressure gas groove 408 which is a differential pumping unit. In addition, the bottom part of AB/DP module 400 may include several orifices 409 which form an air bearing unit. The manner in which a gas cushion (dynamic seal) is formed is illustrated, for example, in U.S. Pat. No. 6,899,765 which is incorporated herein by reference. Different conduits can provide gas at different pressure and/or vacuum levels.

AB/DP module 400 may be mechanically connected to sidewall 204 by a clamping mechanism 401. The clamping mechanism 401 is arranged around the perimeter of AB/DP module 400 and are adapted to provide sufficient force to compensate for the force of the pressure differential between the AB/DP module 400 and the atmosphere.

Figure 6:
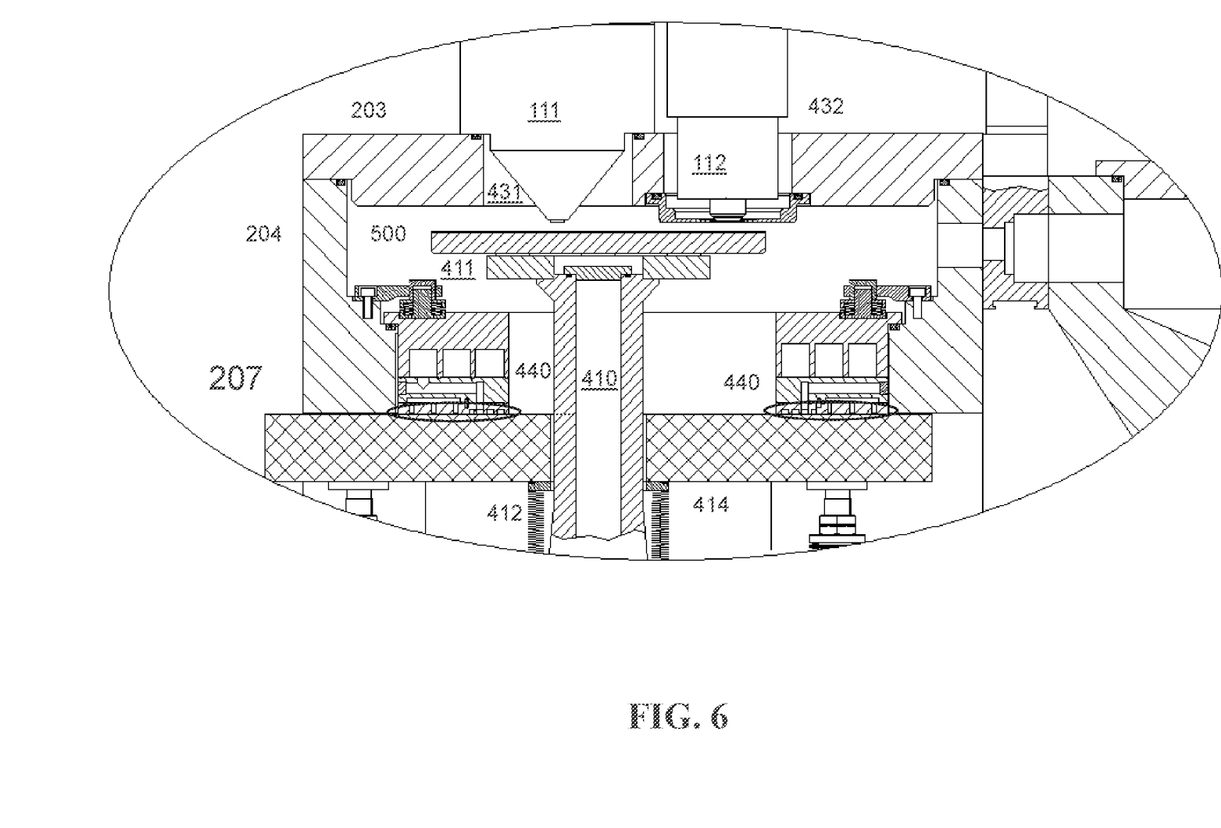
FIG. 6 is an example of a cross sectional view of some evaluation chamber elements.

FIGS. 5 and 6 illustrate various parts of the cluster tool 100 such as cover 203, scanning electron microscope 111, optical microscope 112, chuck 205, support element 410, sealing plate 207, first opening 431, second opening 432, first bellows 412 and second bellows 414.

Support element 410 supports chuck 205 and mechanically coupled chuck 205 to the movement system 206.

FIGS. 5 and 6 also illustrate dynamic seals 440.

First bellows 412 and second bellows 414 surround the support element 410 in order to prevent a leakage of particles from the movement system 206 into vacuumed space 411.

First opening 431 and second opening 432 are formed in cover 203. A lower part of scanning electron microscope 111 is inserted through first opening 431. A lower part of optical microscope 112 is inserted through second opening 432.

The sealing plate 207 of FIG. 6 is positioned in a different position than the sealing plate 207 of FIG. 5—due to a movement of the sealing plate 207 (as well as the support element 410 and the chuck 205) by the movement system.

Figure 7:
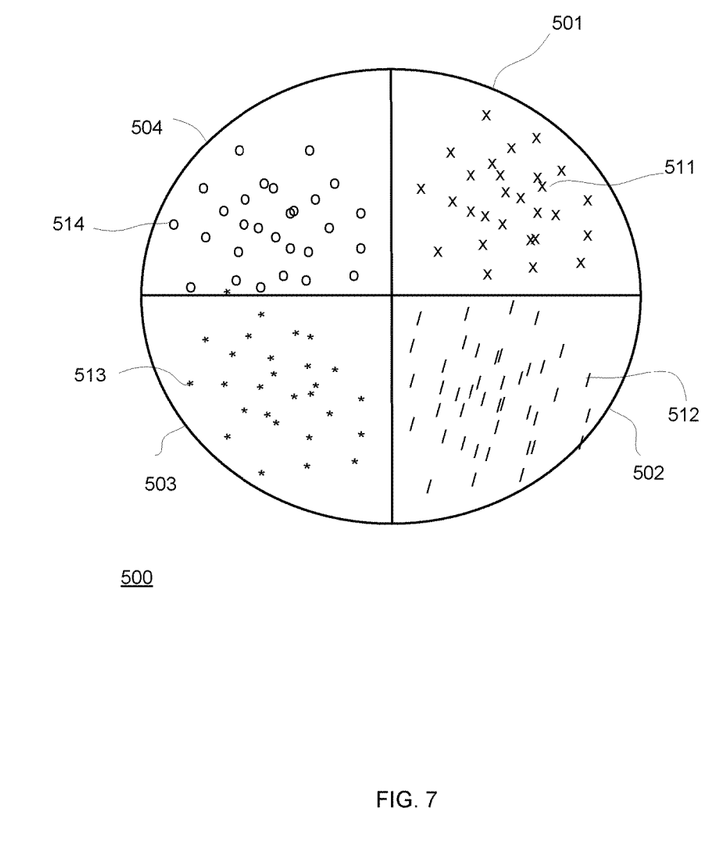
FIG. 7 is an example of a substrate.

FIG. 7 illustrates an example of substrate 500, first region 501, second region 502, third region 503, fourth region 504, portions 511 of first region 501, portions 512 of second region 502, portions 513 of third region 503 and portions 514 of fourth region 504.

Substrate 500 has a symmetrical symmetry and first region 501, second region 502, third region 503, fourth region 504 have a quadrant shape.

The evaluation chamber 106 may evaluate substrate 500 by four iterations. A single region may be evaluated during each iteration of the four iterations. Each iteration may start by rotating the substrate 500 by ninety degrees in order to reach the region that should be evaluated during the iteration.

Reaching regions means that portions of the region can be positioned within the field of view of the scanning electron microscope and the field of view of the optical microscope by moving the chuck.

The movement of the chuck are limited to movement that do should not cause another region of the substrate to be positioned within the field of view of the scanning electron microscope and/or within the field of view of the optical microscope.

During a first iteration, portions 511 of first region 501 may be positioned within the within the field of view of the scanning electron microscope and/or within the field of view of the optical microscope.

During a second iteration, portions 512 of second region 502 may be positioned within the within the field of view of the scanning electron microscope and/or within the field of view of the optical microscope.

During a third iteration, portions 513 of third region 503 may be positioned within the within the field of view of the scanning electron microscope and/or within the field of view of the optical microscope.

During a fourth iteration, portions 514 of fourth region 504 may be positioned within the within the field of view of the scanning electron microscope and/or within the field of view of the optical microscope.

Figure 8:
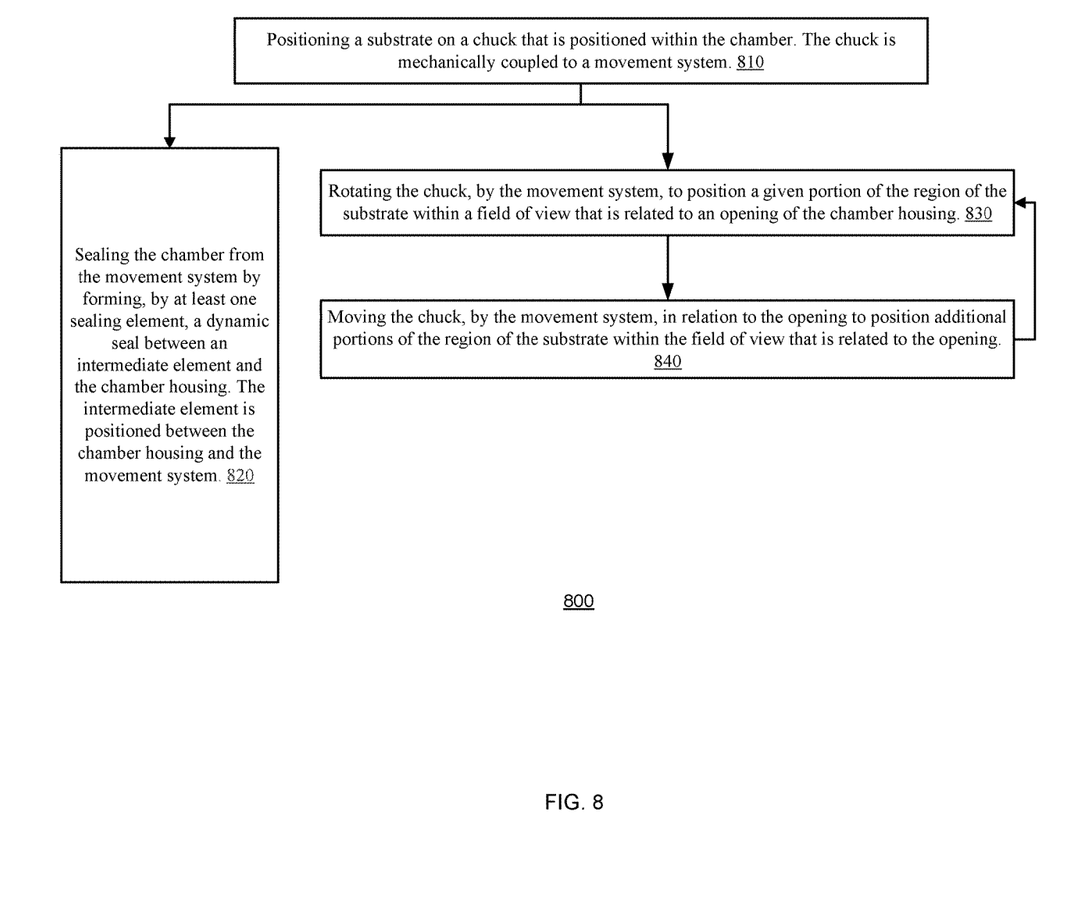
FIG. 8 is an example of a method.

FIG. 8 is an example of method 800 for moving a substrate within a chamber that includes a chamber housing.

Method 800 may start by step 810 of positioning a substrate on a chuck that is positioned within the chamber. The chuck is mechanically coupled to a movement system.

Step 810 may be followed by step 820 of sealing the chamber from the movement system by forming, by at least one sealing element, a dynamic seal between an intermediate element and the chamber housing. The intermediate element is positioned between the chamber housing and the movement system.

Step 810 may also be followed by repeating, for each region of the substrate out of a plurality of regions of the substrate, steps 830 and 840.

Step 830 may include rotating the chuck, by the movement system, to position a given portion of the region of the substrate within a field of view that is related to an opening of the chamber housing.

The field of view is related to the opening in the sense that (a) an evaluation tool that has a field of view may be partially inserted through the opening, and/or (b) an evaluation tool that has a field of view may view the substrate through the opening.

Step 830 may include using a rotary stage of the movement system to rotate the chuck.

Step 830 may be followed by step 840 of moving the chuck, by the movement system, in relation to the opening to position additional portions of the region of the substrate within the field of view that is related to the opening.

Step 830 and 840 may be executed in parallel to step 820.

The substrate may have a radial symmetry and the plurality of regions may include four regions—or any other number of regions.

Step 840 may include at least one of the following:
a. Using an XY (X-axis and Y-axis) stage of the movement system.
b. Moving the intermediate element in relation to the chamber housing while moving the chuck in relation to the opening.
c. Moving the intermediate element by up to a maximal distance in any direction, wherein the maximal distance does not exceed one hundred and twenty percent of a radius of the substrate.

Figure 9:
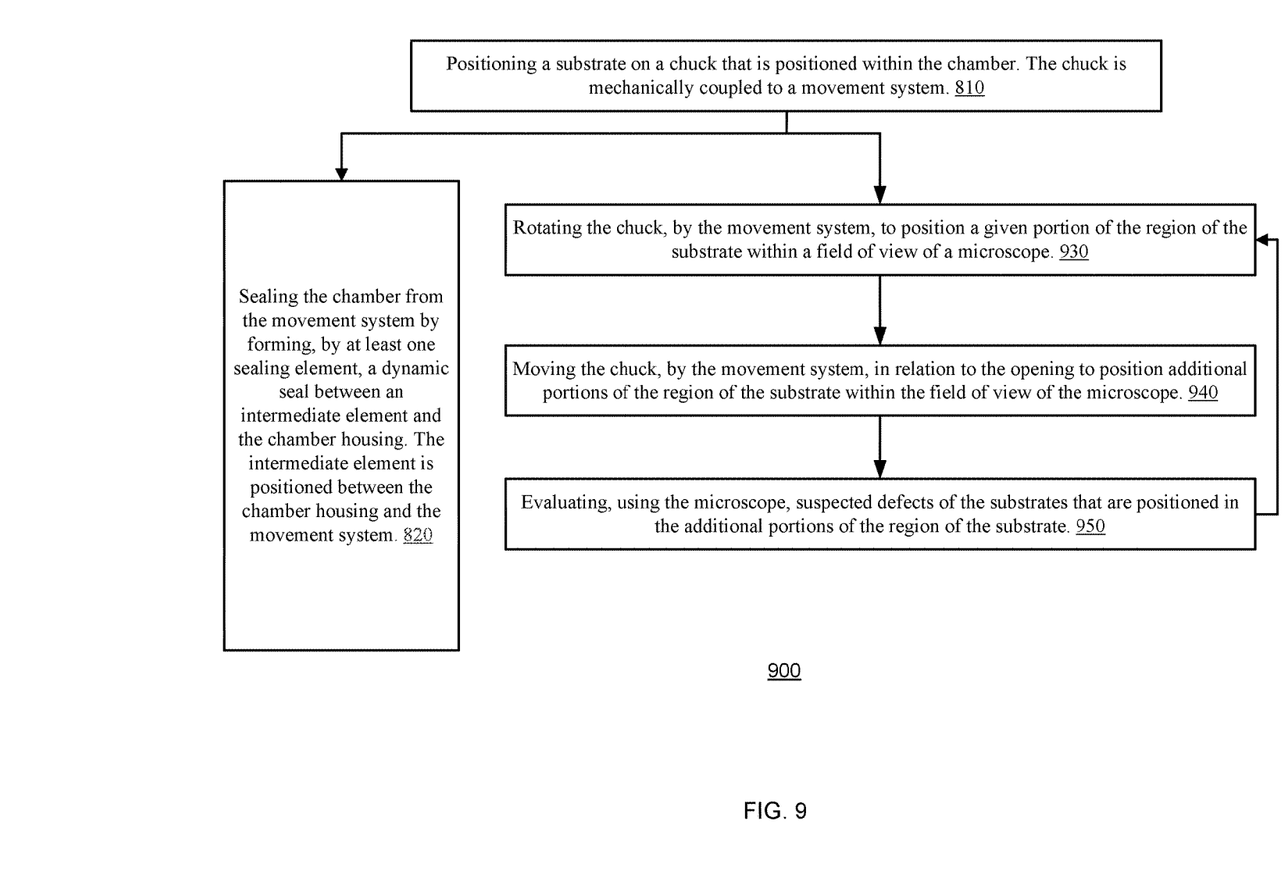
FIG. 9 is an example of a method.

FIG. 9 is an example of method 900 for moving a substrate within a chamber that includes a chamber housing.

Method 900 may start by step 810 of positioning a substrate on a chuck that is positioned within the chamber. The chuck is mechanically coupled to a movement system.

Step 810 may be followed by step 820 of sealing the chamber from the movement system by forming, by at least one sealing element, a dynamic seal between an intermediate element and the chamber housing. The intermediate element is positioned between the chamber housing and the movement system.

Step 810 may also be followed by repeating, for each region of the substrate out of a plurality of regions of the substrate, steps 930, 940 and 950.

Step 930 may include rotating the chuck, by the movement system, to position a given portion of the region of the substrate within a field of view of a microscope.

Step 930 may be followed by step 940 of moving the chuck, by the movement system, in relation to the opening to position additional portions of the region of the substrate within the field of view of the microscope.

Step 940 may be followed by step 950 of evaluating, using the microscope, suspected defects of the substrates that are positioned in the additional portions of the region of the substrate.

The microscope may be a scanning electron microscope.

Step 950 may include finding the suspected defects using an optical microscope and scanning the suspected defects by the scanning electron microscope.

The chamber is compact and it can be integrated with various tools that differ from the cluster tool.

The chamber may be used as a review chamber—in which a review tool such as a scanning electron microscope reviews defects of a substrate positioned within the chamber. The review chamber may be included in an optical inspection system.

The review chamber may be configured to perform immediate, substrate to substrate comparison and accurate control of a processing of the substrate. The substrate may be, for example, a mask or a wafer. The processing of the substrate may include, for example, at least one out of etch, deposition, copper mechanical polishing, and Implant.

The scanning electron microscope may be configured to perform at least one of the following tasks: detect defect, review defects, measure dimensions, measure layer to layer location, measure pattern positioning and edge placement accuracy.

The scanning electron microscope, after completing a task may be configured to provide immediate feedback to a processing tool. The processing tool and the review chamber may belong to the same system. Hence immediate and automated tuning of the processing tool may be provided.

The integration of the review chamber with a process tool allows to perform evaluations of layers or features of a substrate during manufacturing steps that limit the provision of the substrate outside of the process environment defined by the processing tool. The limit may result, for example, due to oxidation.

The inclusion of the chamber in a system that includes a processing tool may provide (a) fast fault response and root cause analysis, (b) improve process quality and process uniformity along the substrate, (c) improve process chamber to process chamber matching.

Most of the wafer fabrication process chambers contain multiple chambers which perform the same operations. (same chemistry, thermal effects, material flows, irradiances and the like). However, there are small differences among chamber real process parameters. The differences will cause fabrication process differences and the final result will be physical differences among wafers due to their history location in the specific chamber. The review chamber will enable to define the differences and to perform immediate parameters tuning which will bring the chambers to match to other and hence to reduce the process differences associated with the differences among chambers.

The chamber facilitates non-destructive inspection, metrology, compositional analysis of moisture, atmosphere and time sensitivity nanofilms and structures.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of step in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described steps are merely illustrative. The multiple may be combined into a single step, a single step may be distributed in additional steps and steps may be executed at least partially overlapping in time. Moreover, alternative embodiments may include multiple instances of a particular step, and the order of steps may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:
1. A system for moving a substrate, the system comprising:
   a chamber that comprises a chamber housing, the chamber housing comprising an opening;
   a chuck that is configured to support the substrate;
   a movement system that is mechanically coupled to the chuck and is positioned outside the chamber;

a controller that is configured to control the movement system;

an intermediate element that is positioned between the chamber housing and the movement system;

at least one sealing element that is configured to form a dynamic seal between the intermediate element and the chamber housing, wherein the dynamic seal seals the chamber from the movement system; and wherein the movement system is configured to repeat, for each region of the substrate out of a plurality of regions of the substrate, the steps of:

rotating the chuck to position a given portion of the region of the substrate within a field of view that is related to the opening of the chamber housing; and moving the chuck in relation to the opening to position additional portions of the region of the substrate within the field of view that is related to the opening.

2. The system according to claim 1 wherein the movement system comprises a rotary stage for rotating the chuck.

3. The system according to claim 1 wherein the movement system comprises an X-axis and Y-axis stage for moving the chuck in relation to the opening.

4. The system according to claim 1 wherein the movement system is configured to move the intermediate element in relation to the chamber housing while moving the chuck in relation to the opening.

5. The system according to claim 1 wherein the movement system is configured to move the intermediate element by up to a maximal distance in any direction, wherein the maximal distance does not exceed one hundred and twenty percent of a radius of the substrate.

6. The system according to claim 1 further comprising sensors that are in fixed positions in relation to the substrate.

7. A method for moving a substrate within a chamber that comprises a chamber housing, the method comprising:

positioning the substrate on a chuck that is positioned within the chamber; wherein the chuck is mechanically coupled to a movement system;

sealing the chamber from the movement system by forming, by at least one sealing element, a dynamic seal between an intermediate element and the chamber housing; wherein the intermediate element is positioned between the chamber housing and the movement system;

repeating, for each region of the substrate out of a plurality of regions of the substrate, the steps of:

rotating the chuck, by the movement system, to position a given portion of the region of the substrate within a field of view that is related to an opening of the chamber housing; and moving the chuck, by the movement system, in relation to the opening to position additional portions of the region of the substrate within the field of view that is related to the opening.

8. The method according to claim 7 wherein the substrate has a radial symmetry and wherein the plurality of regions comprise four regions.

9. The method according to claim 7 wherein the rotating of the chuck comprises using a rotary stage of the movement system to rotate the chuck.

10. The method according to claim 7 wherein the moving of the chuck comprises using an X-axis and Y-axis stage of the movement system.

11. The method according to claim 7 further comprising moving the intermediate element in relation to the chamber housing while moving the chuck in relation to the opening.

12. The method according to claim 11 further comprising moving the intermediate element by up to a maximal distance in any direction, wherein the maximal distance does not exceed one hundred and twenty percent of a radius of the substrate.

13. A method for evaluating a substrate, the method comprising:

positioning the substrate on a chuck that is positioned within a chamber that comprises a chamber housing; wherein the chuck is mechanically coupled to a movement system;

sealing the chamber from the movement system by forming, by at least one sealing element, a dynamic seal between an intermediate element and the chamber housing; wherein the intermediate element is positioned between the chamber housing and the movement system;

repeating, for each region of the substrate out of a plurality of regions of the substrate, the steps of:
(a) rotating the chuck, by the movement system, to position a given portion of the region of the substrate within a field of view of a microscope;
(b) moving the chuck, by the movement system, in relation to the opening to position additional portions of the region of the substrate within the field of view of the microscope; and
(c) evaluating, using the microscope, suspected defects of the substrates that are positioned in the additional portions of the region of the substrate.

14. The method according to claim 13 wherein the microscope is a scanning electron microscope.

15. The method according to claim 14 further comprising finding the suspected defects using an optical microscope and scanning the suspected defects by the scanning electron microscope.

* * * * *